United States Patent
Lee et al.

(10) Patent No.: US 9,312,368 B2
(45) Date of Patent: Apr. 12, 2016

(54) GRAPHENE DEVICE INCLUDING SEPARATED JUNCTION CONTACTS AND METHOD OF MANUFACTURING THE SAME

(71) Applicant: Samsung Electronics Co., Ltd., Suwon-Si, Gyeonggi-Do (KR)

(72) Inventors: Jae-ho Lee, Seoul (KR); Kyung-eun Byun, Uijeongbu-si (KR); Hyun-jae Song, Hwaseong-si (KR); Hyeon-jin Shin, Suwon-si (KR); Min-Hyun Lee, Yongin-si (KR); In-kyeong Yoo, Yongin-si (KR); Seong-jun Park, Seoul (KR)

(73) Assignee: Samsuung Electronics Co., LTD., Gyeonggi-do (KR)

( * ) Notice: Subject to any disclaimer, the term of this patent is extended or adjusted under 35 U.S.C. 154(b) by 0 days.

(21) Appl. No.: 14/334,028

(22) Filed: Jul. 17, 2014

(65) Prior Publication Data

US 2015/0137074 A1     May 21, 2015

(30) Foreign Application Priority Data

Nov. 15, 2013   (KR) .......................... 10-2013-0139321

(51) Int. Cl.
*H01L 29/06*     (2006.01)
*H01L 29/66*     (2006.01)
*H01L 29/78*     (2006.01)
*H01L 29/16*     (2006.01)
(Continued)

(52) U.S. Cl.
CPC ........ *H01L 29/66977* (2013.01); *H01L 29/165* (2013.01); *H01L 29/1606* (2013.01); *H01L 29/267* (2013.01); *H01L 29/78* (2013.01)

(58) Field of Classification Search
CPC ................... H01L 21/02527; H01L 21/02573; H01L 21/02612; H01L 21/8213; H01L 21/823807; H01L 29/1906; H01L 29/165; H01L 29/66431; H01L 29/7781; H01L 29/78618; H01L 29/78684; H01L 29/0665; H01L 29/0673; B82Y 10/00
USPC ............... 257/27, 29, 24, 39, 77, 76, 529, 40; 438/53, 510, 283, 478, 197, 158
See application file for complete search history.

(56) References Cited

U.S. PATENT DOCUMENTS

| | | | |
|---|---|---|---|
| 8,803,130 B2 * | 8/2014 | Afzali-Ardakani | ... H01L 29/772 257/29 |
| 2009/0020764 A1 * | 1/2009 | Anderson | ........... H01L 29/1606 257/77 |

(Continued)

FOREIGN PATENT DOCUMENTS

JP      2013-004718 A      1/2013

*Primary Examiner* — Mohammed Shamsuzzaman
(74) *Attorney, Agent, or Firm* — Harness, Dickey & Pierce, P.L.C.

(57) ABSTRACT

A graphene device including separated junction contacts and a method of manufacturing the same are disclosed. The graphene device is a field effect transistor (FET) in which graphene is used as a channel. A source electrode and a drain electrode do not directly contact the graphene channel, and junction contacts formed by doping semiconductor are separately disposed between the graphene channel and the source electrode and between the graphene channel and the drain electrode. Therefore, in an off state where a voltage is not applied to a gate electrode, due to a barrier between the graphene channel and the junction contacts, carriers may not move. As a result, the graphene device may have low current in the off state.

12 Claims, 6 Drawing Sheets

(51) Int. Cl.
*H01L 29/165* (2006.01)
*H01L 29/267* (2006.01)

(56) References Cited

U.S. PATENT DOCUMENTS

| | | | |
|---|---|---|---|
| 2011/0253980 A1* | 10/2011 | Chang | B82Y 10/00 257/24 |
| 2012/0012939 A1* | 1/2012 | Wenwu | H01L 21/823842 257/369 |
| 2012/0049160 A1* | 3/2012 | Sano | H01L 21/8213 257/27 |
| 2012/0228631 A1* | 9/2012 | Kono | H01L 29/4966 257/77 |
| 2012/0326126 A1* | 12/2012 | Chen | H01L 29/42384 257/29 |
| 2013/0119349 A1 | 5/2013 | Chung et al. | |
| 2014/0014905 A1 | 1/2014 | Lee et al. | |
| 2014/0097403 A1* | 4/2014 | Heo | H01L 29/7391 257/27 |
| 2014/0117313 A1 | 5/2014 | Lee et al. | |
| 2014/0231752 A1 | 8/2014 | Shin et al. | |

* cited by examiner

GRAPHENE DEVICE INCLUDING SEPARATED JUNCTION CONTACTS AND METHOD OF MANUFACTURING THE SAME

RELATED APPLICATIONS

This application claims priority from Korean Patent Application No. 10-2013-0139321, filed on Nov. 15, 2013, in the Korean Intellectual Property Office, the disclosure of which is incorporated herein in its entirety by reference.

BACKGROUND

1. Field

Example embodiments relate to a graphene device and a method of manufacturing the same, and more particularly, to a graphene device including separated junction contacts so that an off-current characteristic is improved, and a method of manufacturing the same.

2. Description of the Related Art

Graphene is a material having a generally two-dimensional hexagonal structure in which carbon atoms are hexagonally connected on one plane and has a small thickness of about an atomic layer. Since graphene has stable and high electrical/mechanical/chemical characteristics and has high conductivity, graphene is spotlighted as a next generation material. In particular, many researches on nano devices using graphene are performed.

SUMMARY

According to at least one example embodiment, a graphene device may include a graphene channel layer, a gate electrode for applying an electric field to the graphene channel layer, and first and second junction contact layers that contact the graphene channel layer. The first and second junction contact layers may be electrically separated from each other.

The graphene device may further include a substrate. The first and second junction contact layers may be adjacently disposed on a top surface of the substrate.

The first and second junction contact layers may be doped to have the same conduction type. The substrate may be doped to have an electrically opposite conduction type to the conduction type of the first and second junction contact layers.

The substrate may be formed of an insulating material.

The graphene device may further include a separation film disposed between the first junction contact layer and the second junction contact layer in order to electrically separate the first junction contact layer and the second junction contact layer from each other.

The separation film may include a trench formed by performing etching to a part of the substrate to pass through between the first junction contact layer and the second junction contact layer and an insulating material filled in the trench.

The graphene channel layer may be disposed on top surfaces of the first junction contact layer, the separation film, and the second junction contact layer.

The graphene device may further include a gate insulating film disposed on the top surfaces of the first junction contact layer and the second junction contact layer to cover the graphene channel layer. The gate electrode may be disposed on the gate insulating film to face the graphene channel layer.

The graphene device may further include a source electrode contacting the first junction contact layer and a drain electrode contacting the second junction contact layer.

The source electrode may be disposed on the top surface of the first junction contact layer and may be extended to a first side of the gate insulating film. The drain electrode may be disposed on the top surface of the second junction contact layer and may be extended to a second side of the gate insulating film.

The graphene device may further include a substrate formed of an insulating material. The gate electrode may be disposed on the substrate.

The graphene device may further include a gate insulating film substantially or entirely disposed on top surfaces of the substrate and the gate electrode to cover the gate electrode. The graphene channel layer may be partially disposed on a top surface of the gate insulating film to face the gate electrode. The first junction contact layer and the second junction contact layer may be disposed on both sides of the graphene channel layer, respectively.

The graphene device may further include a separation film disposed between the first junction contact layer and the second junction contact layer to electrically separate the first junction contact layer and the second junction contact layer from each other. The first junction contact layer and the second junction contact layer may be doped to have the same conduction type.

The first junction contact layer may be disposed on parts of the top surface of the gate insulating film and/or a top surface of the graphene channel layer so as to contact a part of the graphene channel layer. The second junction contact layer may be disposed on other parts of the top surface of the gate insulating film and the top surface of the graphene channel layer so as to contact another part of the graphene channel layer.

According to another example embodiment, a method of manufacturing a graphene device may include substantially or entirely forming a doped junction contact layer on a top surface of a substrate, forming a trench by performing etching to a part of the substrate through a center portion of the junction contact layer to divide the junction contact layer into a first junction contact layer and a second junction contact layer, forming a graphene channel layer on top surfaces of the first and second junction contact layers, forming a gate insulating film on the top surfaces of the first and second junction contact layers so as to substantially or entirely cover the graphene channel layer, forming a source electrode and a drain electrode on the first junction contact layer and the second junction contact layer, respectively, and forming a gate electrode on the gate insulating film to face the graphene channel layer.

The substrate may be formed of, or include a semiconductor material doped to have a first conduction type. The top surface of the substrate may be doped to have a second conduction type electrically opposite to the first conduction type so that the junction contact layer is formed.

The method may further include filling an inside of the trench with an insulating material after forming the trench.

The forming of the graphene channel layer may include substantially or entirely forming graphene on the top surfaces of the first and second junction contact layers and removing graphene at edges or sides of the top surfaces of the first and second junction contact layers.

The forming of the gate insulating film may include substantially or entirely forming an insulating material on the top surfaces of the first and second junction contact layers and the top surface of the graphene channel layer and removing the insulating material so that the edges or sides of the top surfaces of the first and second junction contact layers are partially exposed.

The forming of the source electrode, the drain electrode, and the gate electrode may include substantially or entirely coating the first and second junction contact layers and the gate insulating film with a conductive material, and patterning the first and second junction contact layers and the gate insulating film to contemporaneously or simultaneously form the source electrode, the drain electrode, and the gate electrode.

BRIEF DESCRIPTION OF THE DRAWINGS

These and/or other example embodiments will become apparent and more readily appreciated from the following description of the example embodiments, taken in conjunction with the accompanying drawings in which.

DETAILED DESCRIPTION

Figure 1:
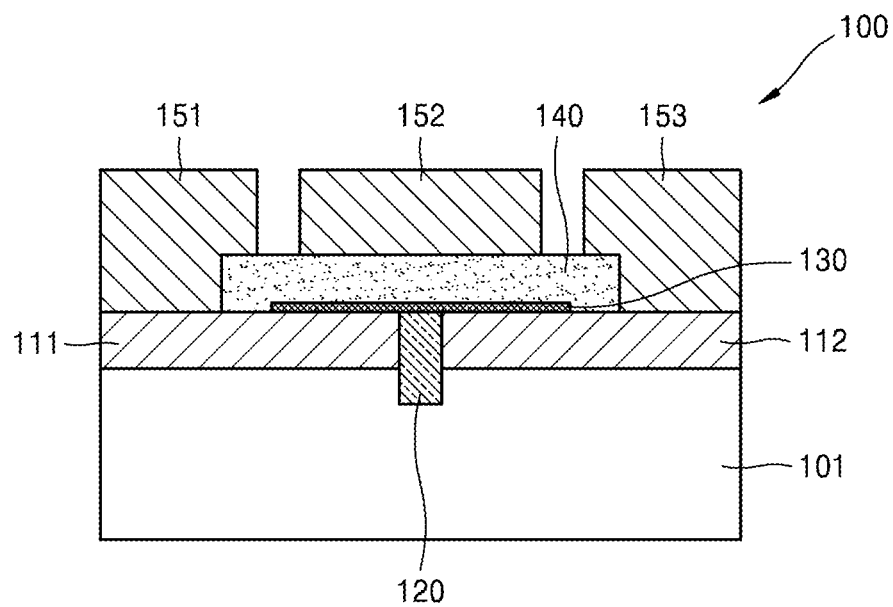
FIG. 1 is a cross-sectional view schematically illustrating a structure of a graphene device according to at least one example embodiment.

A graphene device including separated junction contacts and a method of manufacturing the same now will be described more fully hereinafter with reference to the accompanying drawings, in which elements of the inventive concept are shown. The inventive concept may, however, be embodied in many different forms and should not be construed as limited to the example embodiments set forth herein.

Rather, these example embodiments are provided so that this disclosure will be thorough and complete, and will fully convey the scope of the inventive concept to one of ordinary skill in the art. In the drawings, the thickness of layers and regions are exaggerated for clarity.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

FIG. 1 is a cross-sectional view schematically illustrating a structure of a graphene device 100 according to an example embodiment. Referring to FIG. 1, the graphene device 100 according to an example embodiment includes a substrate 101, a first junction contact layer 111 and a second junction contact layer 112 adjacently disposed on a top surface of the substrate 101, a separation film 120 disposed between the first junction contact layer 111 and the second junction contact layer 112 and electrically separating the first junction contact layer 111 and the second junction contact layer 112 from each other, a graphene channel layer 130 disposed on at least portions of the top surfaces of the first junction contact layer 111 and of the second junction contact layer 112, a gate insulating film 140 disposed on at least portions of the top surfaces of the first junction contact layer 111 and of the second junction contact layer 112 and covering the graphene channel layer 130, a source electrode 151 disposed on at least a portion of the first junction contact layer 111, a gate electrode 152 disposed on the gate insulating film 140, and a drain electrode 153 disposed on at least a portion of the second junction contact layer 112.

The substrate 101 may be a semiconductor substrate including silicon (Si), zinc oxide (ZnO), germanium (Ge), gallium arsenide (GaAs), silicon carbide (SiC), aluminum phosphide (AlP), indium phosphide (InP), and aluminum arsenide (AlAs). In addition, the substrate 101 may be an insulating substrate including glass, plastic, and $Al_2O_3$.

The first and second junction contact layers 111 and 112 may be formed of a semiconductor material including Si, ZnO, Ge, GaAs, SiC, AlP, InP, and AlAs and may be n-type or p-type doped. The first and second junction contact layers 111 and 112 may be doped to have the same conduction type. For example, both of the first and second junction contact layers 111 and 112 may be n-type or p-type doped. When the first and second junction contact layers 111 and 112 are n-type doped, the graphene device 100 is a negative-channel metal oxide semiconductor (NMOS). When the first and second junction contact layers 111 and 112 are p-type doped, the graphene device 100 is a positive-channel MOS (PMOS).

According to at least one example embodiment, when the substrate 101 is formed of the semiconductor material, in order to prevent current leakage, the substrate 101 may be doped to have an opposite conduction type to the conduction type of the first and second junction contact layers 111 and 112. For example, the substrate 101 may be p-type doped while the first and second junction contact layers 111 and 112 may be n-type doped, or the substrate 101 may be n-type doped while the first and second junction contact layers 111 and 112 may be p-type doped. When the substrate 101 is formed of the insulating material, the substrate 101 does not need to be doped.

The first junction contact layer 111 and the second junction contact layer 112 may be electrically separated from each other by the separation film 120 disposed therebetween. The separation film 120 may be a shallow trench isolation (STI) formed by performing etching to a part of the substrate 101 to pass through between the first junction contact layer 111 and the second junction contact layer 112. When the inside of the trench formed by etching is not filled, the separation film 120 may include air. However, the inside of the trench may be filled with a material having a large band gap such as, for example, $SiO_2$ or SiNx so that the separation film 120 may be formed.

The graphene channel layer 130 may be formed of a single layer or of a multilayer graphene, and may be disposed on at least portions of top surfaces of the first junction contact layer 111, the separation film 120, and the second junction contact layer 112. Therefore, the first junction contact layer 111 and the second junction contact layer 112 may be connected by the graphene channel layer 130. As described later, the graphene channel layer 130 connectingly provided between the first junction contact layer 111 and the second junction contact layer 112 may be a channel between a source and a drain.

The gate insulating film 140 may be formed of an insulating material such as, for example, $SiO_2$, SiNx, $HfO_2$, and $ZrO_2$. The gate insulating film 140 may substantially or completely cover the graphene channel layer 130 so that the graphene channel layer 130 is not exposed to the outside. For this purpose, the gate insulating film 140 may be disposed to cover the graphene channel layer 130 on at least portions of the top surfaces of the first junction contact layer 111 and the second junction contact layer 112.

The source electrode 151 and the drain electrode 153 may be formed of a metal material such as platinum (Pt), nickel (Ni), gold (Au), palladium (Pd), cobalt (Co), beryllium (Be), rhenium (Re), ruthenium (Ru), steel (Fe), tungsten (W), antimony (Sb), molybdenum (Mo), silver (Ag), and chrome (Cr), or of a polysilicon (p-Si). As illustrated in FIG. 1, the source electrode 151 may be disposed on at least a portion of the first junction contact layer 111 to contact the first junction contact layer 111, and the drain electrode 153 may be disposed on at least a portion of the second junction contact layer 112 to contact the second junction contact layer 112. In addition, portions of the source electrode 151 and of the drain electrode 153 may be extended to also cover a portion of the gate insulating film 140. In addition, the gate electrode 152, disposed on the gate insulating film 140, may be formed of a conductive metal oxide such as indium tin oxide (ITO), polysilicon, or a metal material. As illustrated in FIG. 1, the gate electrode 152 may be disposed on the gate insulating film 140 opposite the graphene channel layer 130. The gate electrode 152 may apply an electric field to the graphene channel layer 130 to switch the graphene device 100 between an on state and an off state.

The graphene device 100 according to at least one example embodiment of the above-described structure may operate as a field effect transistor (FET). As described above, since graphene has high electrical conductivity and high carrier mobility, the FET that uses graphene as the channel layer may have high performance. However, in the case of a common FET that uses graphene as the channel layer, since high current flows between a source and a drain even in an off state, switching between an on state and an off state may not be easily performed.

According to at least one example embodiment, as illustrated in FIG. 1, the source electrode 151 and the drain electrode 153 do not directly contact the graphene channel layer 130 but are connected to the graphene channel layer 130 via the first and second junction contact layers 111 and 112. For example, the source electrode 151 may be connected to the graphene channel layer 130 via the first junction contact layer 111 and the drain electrode 153 may be connected to the graphene channel layer 130 via the second junction contact layer 112. Therefore, as described later, in the off state where a voltage is not applied to the gate electrode 152, due to a barrier between the graphene channel layer 130 and the second junction contact layer 112, carriers may not move from the graphene channel layer 130 to the second junction contact layer 112 (refer to FIG. 2B). As a result, since the graphene device 100 according to an example embodiment has a low current in the off state, the graphene device 100 may be used as a switching device. Generally, contact between graphene and metal is not good. However, according to an example embodiment, since the source electrode 151 and the drain electrode 153 contact the first and second junction contact layers 111 and 112 that are semiconductors, the contact between graphene and the metal may be improved.

Figure 2A:
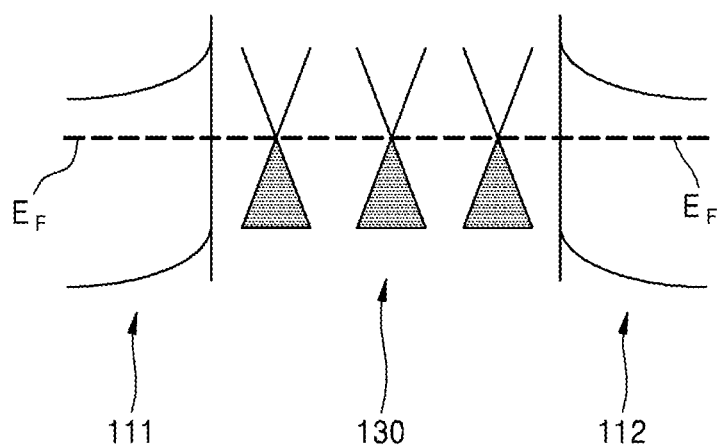
FIGS. 2A to 2C are energy band diagrams schematically illustrating an operation of the graphene device of FIG. 1.
Figure 2B:
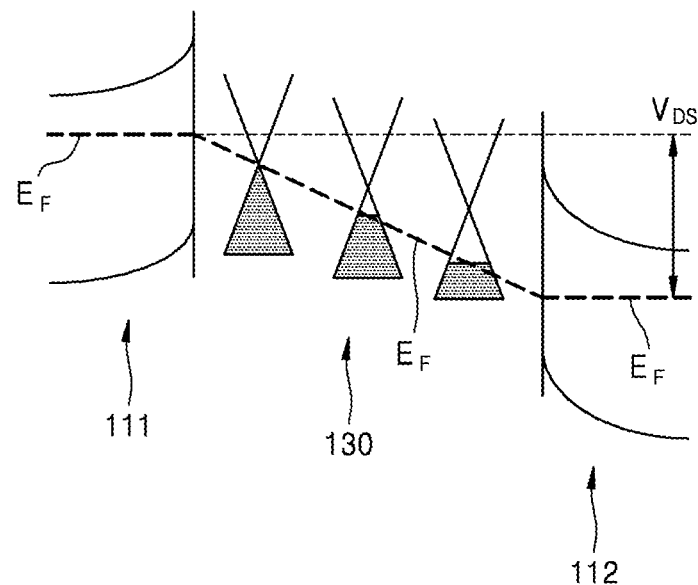
Figure 2C:
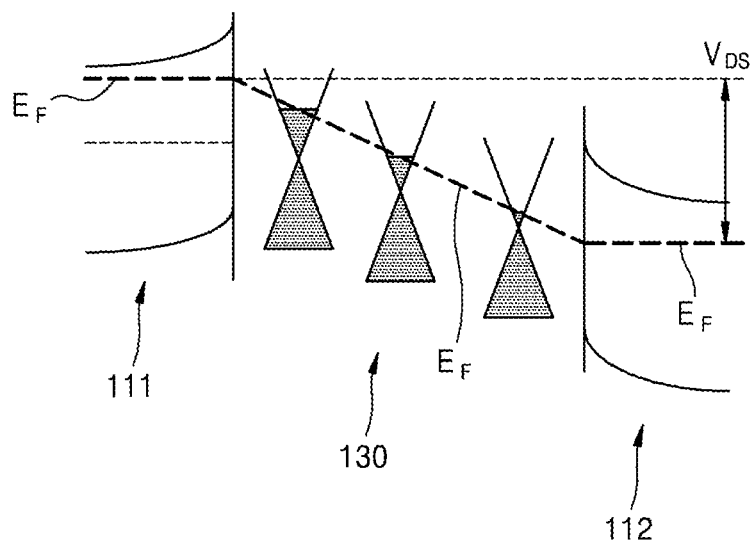

FIGS. 2A and 2C are energy band diagrams schematically illustrating an operation of the graphene device 100 according to at least one example embodiment of FIG. 1. In FIGS. 2A to 2C, it is assumed that the graphene device 100 is a NMOS in which the first and second junction contact layers 111 and 112 are n-type doped.

First, FIG. 2A is an energy band diagram in a floating state where there is no electric potential difference between the source electrode 151 and the drain electrode 153 and a voltage is not applied to the gate electrode 152. Referring to FIG. 2A, a Fermi energy level $E_F$ marked with a thick dotted line is equal at the first and second junction contact layers 111 and 112 and the graphene channel layer 130. In the graphene channel layer 130, the carriers are confined under the Fermi energy level $E_F$. Therefore, due to an energy difference between the Fermi energy level $E_F$ and a conduction band of the second junction contact layer 112, movement of carriers (for example, electrons) from the graphene channel layer 130 to the second junction contact layer 112 is limited.

In addition, FIG. 2B is an energy band diagram in a state (that is, an off state) where a voltage is not applied to the gate electrode 152 but a positive voltage is applied to the drain electrode 153. Referring to FIG. 2B, a Fermi energy level $E_F$ marked with a thick dotted line is lowered at the second junction contact layer 112. A thin dotted line illustrated in FIG. 2B is a Fermi energy level $E_F$ at the first junction contact layer 111 and is equal to the Fermi energy level at the floating state illustrated in FIG. 2A. Then, as illustrated in FIG. 2B, a Fermi energy level $E_F$ at the graphene channel layer 130 is gradually lowered from the first junction contact layer 111 to the second junction contact layer 112. Therefore, a work function of the graphene channel layer 130 varies with the distance between the first junction contact layer 111 and the second junction contact layer 112. In this example embodiment, the Fermi energy level $E_F$ of the second junction contact layer 112 is also lowered. However, since the energy difference between the Fermi energy level $E_F$ and the conduction band of the second junction contact layer 112 is increased, the movement of the carriers from the graphene channel layer 130 to the second junction contact layer 112 is limited. Therefore, the graphene device 100 according to an example embodiment may maintain a low current between the source and the drain in the off state.

Finally, FIG. 2C is an energy band diagram in a state (that is, an on state) where a positive voltage is applied to the gate electrode 152 and the drain electrode 153. Referring to FIG. 2C, a Fermi energy level $E_F$ marked with a thick dotted line is substantially or entirely increased at the first and second junction contact layers 111 and 112 and at the graphene channel layer 130 in the on state in comparison with the Fermi energy level $E_F$ in the off state illustrated in FIG. 2B. In FIG. 2C, a thin dotted line marked in the first junction contact layer 111 represents the Fermi energy level in the off state. Accordingly, the work function of the graphene channel layer 130 is increased and the energy difference between the Fermi energy level $E_F$ and the conduction band of the second junction contact layer 112 is reduced. When a voltage of no less than a threshold voltage is applied to the gate electrode 152, since the energy difference between the Fermi energy level $E_F$ and the conduction band of the second junction contact layer 112 is sufficiently reduced, the carriers in the graphene channel layer 130 may be tunneled into the second junction contact layer 112. Therefore, current may flow between the source electrode 151 and the drain electrode 153.

The above example embodiment illustrates an example where the graphene device 100 is a NMOS. However, the same principle may be applied when the graphene device 100 is a PMOS. For example, when a negative voltage is applied to the gate electrode 152, since the work function of the graphene channel layer 130 is lowered and an energy difference between the Fermi energy level and a valance band of the second junction contact layer 112 is sufficiently reduced, carriers (for example, holes) in the graphene channel layer 130 may be tunneled into the second junction contact layer 112.

As described above, in the graphene device 100 according to an example embodiment, since the first junction contact layer 111 and the second junction contact layer 112 are interposed between the source electrode 151 and the graphene channel layer 130, and between the drain electrode 153 and the graphene channel layer 130, respectively, a low current may be maintained in the off state. Therefore, switching between the on state and the off state may be easily performed.

FIGS. 3A to 3F are cross-sectional views schematically illustrating processes of manufacturing the graphene device 100 of FIG. 1, according to at least one example embodiment. Hereinafter, referring to FIGS. 3A to 3F, a method of manufacturing the graphene device 100 according to an example embodiment will be described in detail.

Figure 3A:
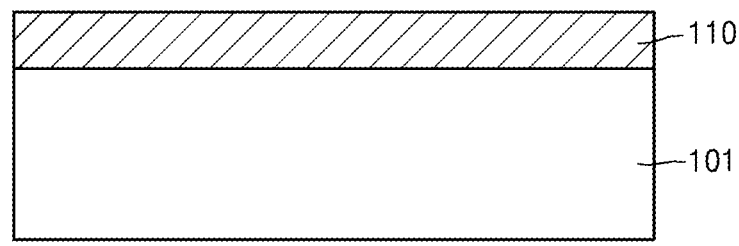
FIGS. 3A to 3F are cross-sectional views schematically illustrating processes of manufacturing the graphene device of FIG. 1.

First, referring to FIG. 3A, a junction contact layer 110 is substantially or entirely formed on the top surface of the substrate 101. When the substrate 101 is formed of a semiconductor material, after the substrate 101 is substantially or entirely, for example, n-type doped, the top surface of the substrate 101 may be p-type doped so that a p-type doped junction contact layer 110 may be formed or, after the substrate 101 is substantially or entirely p-type doped, the top surface of the substrate 101 may be n-type doped so that an n-type doped junction contact layer 110 may be formed. When the substrate 101 is formed of an insulating material, an n-type or p-type doped semiconductor material may be stacked on the top surface of the substrate 101 so that the junction contact layer 110 may be formed or, after a non-doped semiconductor material is stacked on the top surface of the substrate 101, the semiconductor material may be n-type or p-type doped so that the junction contact layer 110 may be formed.

Figure 3B:
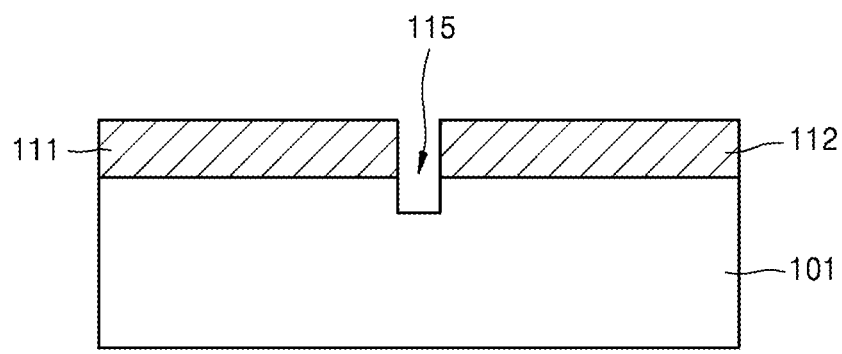

Next, referring to FIG. 3B, etching is performed to at least a portion of the substrate 101 through the center, or other portion, of the junction contact layer 110 to form a trench 115. The junction contact layer 110 may thus be divided into the first junction contact layer 111 and the second junction contact layer 112 by the trench 115.

Figure 3C:
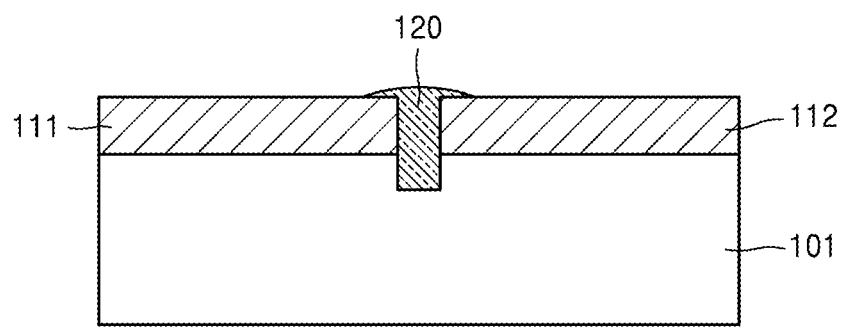

Referring to FIG. 3C, the inside of the trench 115 may be filled with an insulating material with, for example, a large band gap so that the separation film 120 may be formed. For example, when the substrate 101 and the first and second junction contact layers 111 and 112 are formed of Si, $SiO_2$ may be grown in the trench 115 through an oxidation process so that the trench 115 may be filled with $SiO_2$. Alternatively, an insulating material may be applied on the first and second junction contact layers 111 and 112 so that the inside of the trench 115 may be filled with the insulating material. Alternatively, the inside of the trench 115 may not be filled and a separation film 120 formed of air may be provided and/or used. As illustrated in FIG. 3C, in a process of filling the inside of the trench 115 with the insulating material, a portion of the insulating material may protrude above the top surfaces of the first and second junction contact layers 111 and 112. The protruding portion may be removed by a planarizing process such as chemical mechanical polishing (CMP). However, a planarizing process may also not be performed on the protruding portion of the insulating material.

Figure 3D:
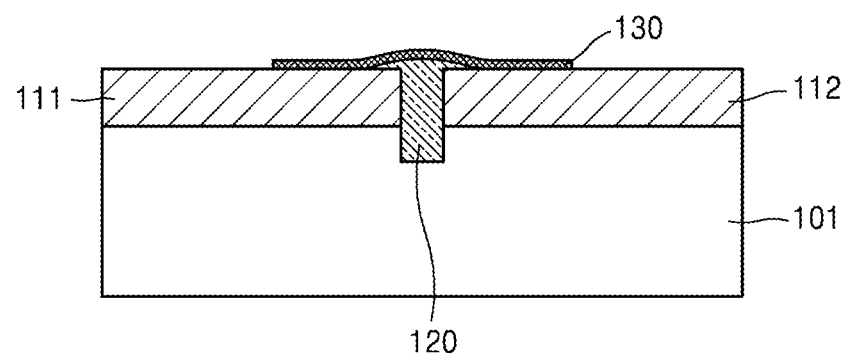

Referring to FIG. 3D, the graphene channel layer 130 may be formed on at least a portion of the top surfaces of the first and second junction contact layers 111 and 112. The graphene channel layer 130 may be formed by, for example, a chemical vapor deposition (CVD) method. As illustrated in FIG. 3D, the graphene channel layer 130 is not formed at edges of the first and second junction contact layers 111 and 112. For this purpose, after graphene is substantially or entirely formed on at least one portion of the top surfaces of the first and second junction contact layers 111 and 112, graphene at the edges of the first and second junction contact layers 111 and 112 is removed so that the graphene channel layer 130 may be formed.

Figure 3E:
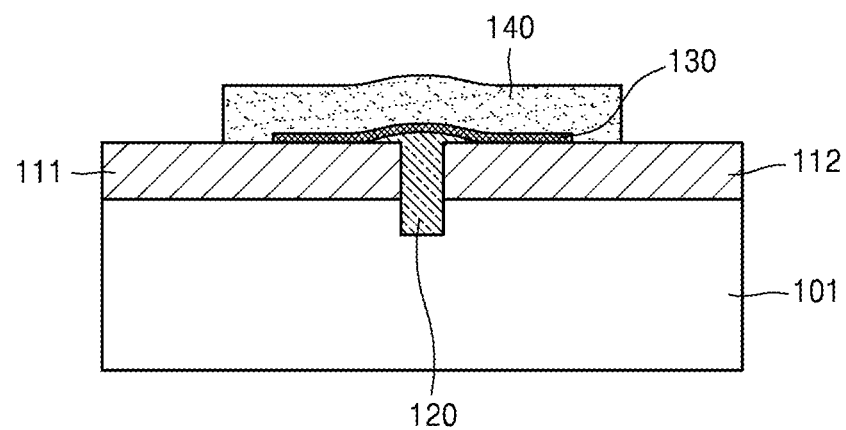

Referring to FIG. 3E, the gate insulating film 140 is formed to substantially or entirely cover the graphene channel layer 130. For example, after at least one portion of the top surfaces of the first and second junction contact layers 111 and 112 and the top surface of the graphene channel layer 130 are substantially or entirely coated with an insulating material, a portion of the insulating material is removed so that the edges of the first and second junction contact layers 111 and 112 are at least partially exposed. As a result, the gate insulating film 140 may be formed.

Figure 3F:
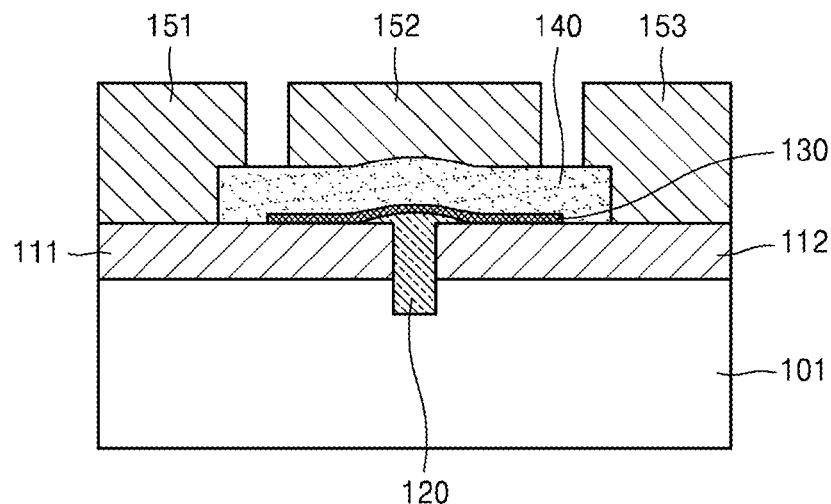

Referring to FIG. 3F, the source electrode 151, the gate electrode 152, and the drain electrode 153 may be formed of a material such as metal or polysilicon completing the graphene device 100. As illustrated in FIG. 3F, the source electrode 151 may be formed to contact the exposed part of the first junction contact layer 111, and the drain electrode 153 may be formed to contact the exposed part of the second junction contact layer 112. The gate electrode 152 may be formed on the gate insulating film 140. For example, the first and second junction contact layers 111 and 112 and the gate insulating film 140 are substantially or entirely coated with a conductive material such as a metal or polysilicon, and are patterned so that the source electrode 151, the gate electrode 152, and the drain electrode 153 may be contemporaneously or simultaneously formed.

Figure 4:
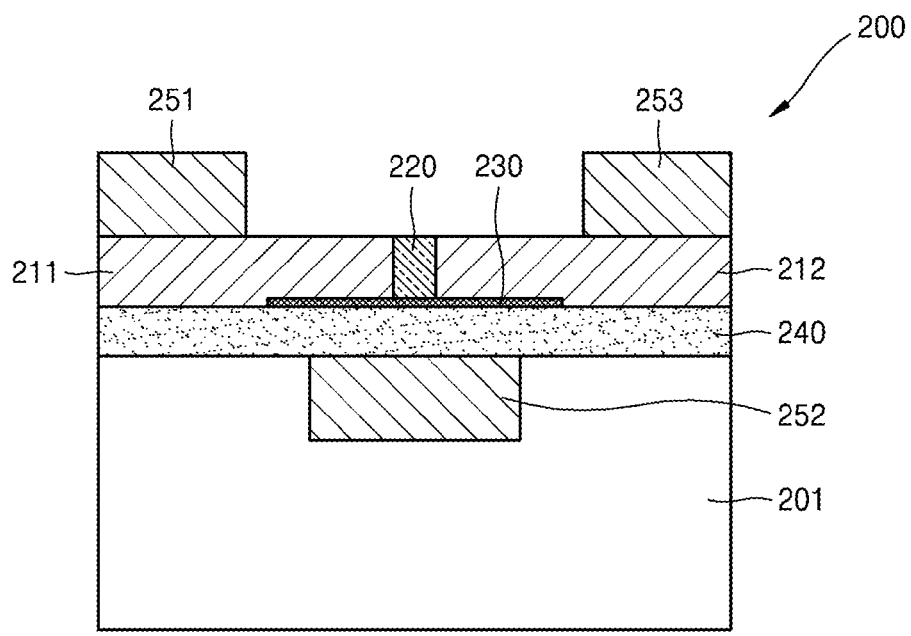
FIG. 4 is a cross-sectional view schematically illustrating a structure of a graphene device according to another example embodiment.

FIG. 4 is a cross-sectional view schematically illustrating a structure of a graphene device 200 according to another example embodiment. The top gate type graphene device 100 in which the gate electrode 152 is provided on the gate insulating film 140 is illustrated above with respect to FIGS. 3A-3F. However, as illustrated in FIG. 4, a bottom gate type graphene device 200 may also be formed, in accordance with at least one example embodiment.

Referring to FIG. 4, the graphene device 200 according to an example embodiment may include a substrate 201, a gate electrode 252 disposed on or inside the substrate 201, a gate insulating film 240 substantially or entirely disposed on top surfaces of the substrate 201 and the gate electrode 252 and covering the gate electrode 252, a graphene channel layer 230 partially disposed on at least one portion of a top surface of the gate insulating film 240 and facing the gate electrode 252, a first junction contact layer 211 and a second junction contact layer 212 disposed on both sides of the graphene channel layer 230, a separation film 220 disposed between the first junction contact layer 211 and the second junction contact layer 212 and electrically separating the first junction contact layer 211 from the second junction contact layer 212, a source electrode 251 disposed on the first junction contact layer 211, and a drain electrode 253 disposed on the second junction contact layer 212.

In FIG. 4, the gate electrode 252 is positioned in the substrate 201 so that the top surface of the gate electrode 252 coincides with, or is flush with, the top surface of the substrate 201. However, an example embodiment is not limited to the above. For example, the gate electrode 252 may protrude above the top surface of the substrate 201. According to an example embodiment, the substrate 201 may be formed of an insulating material. The gate insulating film 240, the graphene channel layer 230, the first junction contact layer 211, the second junction contact layer 212, the separation film 220, the source electrode 251, the gate electrode 252, and the drain electrode 253 may be formed of the same materials as those illustrated in FIG. 1.

The first junction contact layer 211 may be disposed on portions of the top surface of the gate insulating film 240 and of a top surface of the graphene channel layer 230 so as to contact a portion of the graphene channel layer 230. In addition, the second junction contact layer 212 may be disposed on other portions of the top surface of the gate insulating film 240 and of the top surface of the graphene channel layer 230 so as to contact another portion of the graphene channel layer 230. According to an example embodiment, after the separation film 220 is formed on the graphene channel layer 230, the first junction contact layer 211 and the second junction contact layer 212 may be formed. If the junction contact layer is formed first and then the trench is formed, as illustrated in FIG. 3B, in a process of forming the trench in order to divide the junction contact layer into the first junction contact layer 211 and the second junction contact layer 212, the graphene channel layer 230 may be damaged by an etching solution. However, if the graphene channel layer 230 may be prevented from being damaged, the separation film 220 may be subsequently formed.

Figure 5:
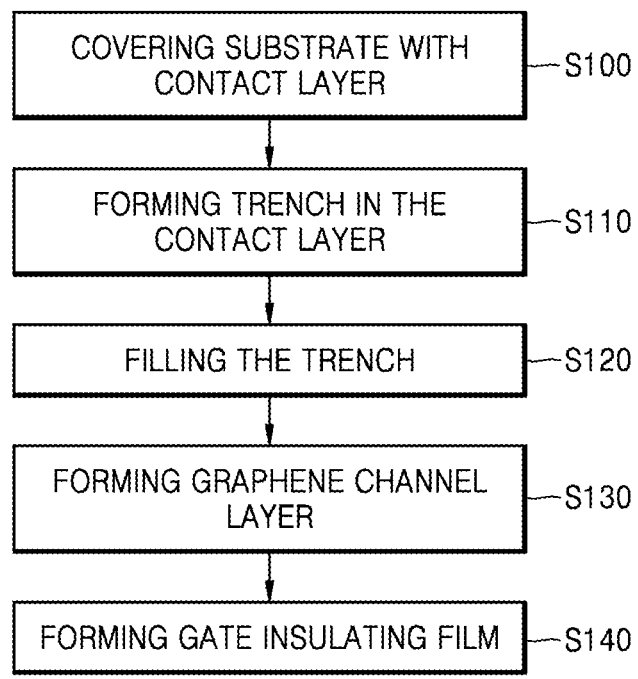
FIG. 5 is a flow chart illustrating a method of manufacturing the graphene device, according to at least one example embodiment.

FIG. 5 is a flow chart illustrating a method of manufacturing the graphene device, according to at least one example embodiment. The method starts at S100, where a junction contact layer is substantially or entirely formed on the top surface of the substrate. At S110, etching is performed to at least a portion of the substrate through the center, or other portion, of the junction contact layer to form a trench, resulting in the junction contact layer being divided in the first junction contact layer and the second junction contact layer by the trench. At S120, the inside of the trench is filled with an insulating material with a large band gap so to form the separation film. At S130, the graphene channel layer is formed on at least a portion of the top surfaces of the first and second junction contact layers and on the separation film. At S140, the gate insulating film is formed to substantially or entirely cover the graphene channel layer. At S150, the source electrode, the gate electrode, and the drain electrode are formed of a material such as metal or polysilicon to complete the graphene device.

It should be understood that the example embodiments described therein should be considered in a descriptive sense only and not for purposes of limitation. Descriptions of features or example embodiments should typically be considered as available for other similar features or example embodiments.

While one or more example embodiments have been described with reference to the figures, it will be understood by those of ordinary skill in the art that various changes in form and details may be made therein without departing from the spirit and scope of the present disclosure as defined by the following claims.

What is claimed is:

1. A graphene device, comprising:
a substrate;
a planar graphene channel layer;
a gate electrode above the planar graphene layer configured to apply an electric field to the planar graphene channel layer;
first and second junction contact layers contacting portions of the graphene channel layer, and wherein the first and second junction contact layers are electrically and physically separated from each other and adjacently disposed on a portion of a top surface of the substrate;
wherein the planar graphene channel layer is on portions of top surfaces of the first junction contact layer, a separation film, and the second junction contact layer;
wherein the separation film comprises a trench formed by etching of a portion of the substrate, the trench being between the first junction contact layer and the second junction contact layer; and an insulating material substantially fill in the trench.

2. The graphene device of claim 1, wherein the first and second junction contact layers are doped to have a same conduction type, and wherein the substrate is doped to have an electrically opposite conduction type to the conduction type of the first and second junction contact layers.

3. The graphene device of claim 1, wherein the substrate comprises an insulating material.

4. The graphene device of claim 1, wherein the separation film electrically separates the first junction contact layer from the second junction contact layer.

5. The graphene device of claim 1, further comprising a gate insulating film on portions of the top surfaces of the first junction contact layer and the second junction contact layer and covering the graphene channel layer, wherein the gate electrode is on the gate insulating film opposite to the graphene channel layer.

6. The graphene device of claim 5, further comprising: a source electrode contacting a portion of the first junction contact layer; and
a drain electrode contacting at least a portion of the second junction contact layer.

7. The graphene device of claim 6, wherein the source electrode is on a portion of the top surface of the first junction contact layer and on a portion of a first side of the gate insulating film, and
wherein the drain electrode is on a portion of the top surface of the second junction contact layer and on a portion of a second side of the gate insulating film.

8. A transistor comprising:
a doped substrate;
a first junction layer coplanar with a second junction layer, the first junction layer and the second junction layer being separated by an insulating trench substantially fill with an insulating material and adjacently disposed on a portion of a top surface of the substrate;
a planar graphene channel layer in contact with portions of the first junction layer, the second junction layer and the insulating trench;
a gate insulating layer in contact with the planar graphene channel layer and portions of the first junction layer and the second junction layer; a gate in contact with the gate insulating layer; and
a source electrode and a drain electrode on uncovered portions of the first junction layer and the second junction layer, respectively;
the source electrode and the drain electrode being connected to the planar graphene channel layer via the first junction layer and the second junction layer, respectively and coplanar with the gate.

9. The transistor of claim 8, wherein one of the first junction layer and the second junction layer comprises silicon.

10. The transistor of claim 8, wherein the first junction layer and the second junction layer are doped to have a same conduction type.

11. The transistor of claim 10, further comprising the doped substrate having an opposite conduction type to the conduction type of the first junction layer and the second junction layer.

12. The graphene device of claim 1, wherein the separation film is between the first junction contact layer and the second junction contact layer.

* * * * *